US010546768B2

(12) United States Patent
Boughton et al.

(10) Patent No.: US 10,546,768 B2
(45) Date of Patent: Jan. 28, 2020

(54) APPARATUS AND METHOD TO ELECTROSTATICALLY CHUCK SUBSTRATES TO A MOVING CARRIER

(71) Applicant: CORNING INCORPORATED, Corning, NY (US)

(72) Inventors: Daniel Robert Boughton, Naples, NY (US); James Gerard Fagan, Painted Post, NY (US); Valerie Elise Mebert, Corning, NY (US)

(73) Assignee: Corning Incorporated, Corning, NY (US)

( * ) Notice: Subject to any disclaimer, the term of this patent is extended or adjusted under 35 U.S.C. 154(b) by 328 days.

(21) Appl. No.: 15/553,676

(22) PCT Filed: Feb. 23, 2016

(86) PCT No.: PCT/US2016/019086
§ 371 (c)(1),
(2) Date: Aug. 25, 2017

(87) PCT Pub. No.: WO2016/137964
PCT Pub. Date: Sep. 1, 2016

(65) Prior Publication Data
US 2018/0053677 A1    Feb. 22, 2018

Related U.S. Application Data

(60) Provisional application No. 62/120,477, filed on Feb. 25, 2015.

(51) Int. Cl.
H01L 21/683    (2006.01)
H01L 21/68     (2006.01)
H01L 21/02     (2006.01)

(52) U.S. Cl.
CPC .... *H01L 21/6833* (2013.01); *H01L 21/02266* (2013.01); *H01L 21/68* (2013.01); *H01L 21/683* (2013.01)

(58) Field of Classification Search
CPC .......... H01L 21/6833; H01L 21/02266; H01L 21/68; H01L 21/683
(Continued)

(56) References Cited

U.S. PATENT DOCUMENTS 5,335,457 A     8/1994  Matsuda et al.
5,542,559 A *   8/1996  Kawakami .......... H01L 21/6838
                                                 216/67
(Continued)

FOREIGN PATENT DOCUMENTS

CN      102217055 A      10/2011
JP        1768699 B2      9/2011
KR     20130117268 A     10/2013

OTHER PUBLICATIONS

Heehwan Choe; "Basic Study of the Electric Forces on a Glass Substrate in a Dry Etching System"; Journal of the Korean Physical Society, vol. 48, No. 5; May 2006; pp. 982-984.
(Continued)

*Primary Examiner* — Zeev V Kitov

(57) ABSTRACT

An electrostatic chucking apparatus includes a movable member arranged for movement relative to an axial axis, at least one electrostatic chuck coupled to the movable member, and a stationary member. At least one moving insulated electrode is coupled to the movable member, and at least one stationary insulated electrode is coupled to the stationary member in an axial position corresponding to the at least one moving insulated electrode. A slip ring contact couples electrical energy from the at least one stationary insulated electrode to the at least one moving insulated electrode.

20 Claims, 10 Drawing Sheets

(58) Field of Classification Search
USPC .......................................................... 361/234
See application file for complete search history.

(56) References Cited

U.S. PATENT DOCUMENTS

| | | | |
|---|---|---|---|
| 5,630,881 A | 5/1997 | Ogure et al. | |
| 5,885,428 A | 3/1999 | Kogan | |
| 5,908,706 A * | 6/1999 | Lehmann | B41N 3/03 |
| | | | 427/327 |
| 6,081,414 A | 6/2000 | Flanigan et al. | |
| 6,120,661 A | 9/2000 | Hirano et al. | |
| 6,125,025 A | 9/2000 | Howald et al. | |
| 6,222,991 B1 | 4/2001 | Davenport | |
| 6,406,590 B1 * | 6/2002 | Ebata | C23C 16/45506 |
| | | | 118/723 E |
| 6,634,650 B2 | 10/2003 | Lerner | |
| 6,740,894 B1 | 5/2004 | Mitchell | |
| 7,196,896 B2 | 3/2007 | Howald et al. | |
| 7,508,646 B2 | 3/2009 | Emoto et al. | |
| 7,527,694 B2 | 5/2009 | Sundar | |
| 7,557,019 B2 | 7/2009 | Mikhael et al. | |
| 7,995,324 B2 | 8/2011 | Kato et al. | |
| 2006/0158822 A1 | 7/2006 | Kondo et al. | |
| 2008/0037196 A1 | 2/2008 | Yonekura et al. | |
| 2008/0061519 A1 | 3/2008 | Cho et al. | |
| 2008/0258411 A1 * | 10/2008 | Miura | C23C 14/505 |
| | | | 279/128 |
| 2008/0266747 A1 | 10/2008 | Shiraiwa et al. | |
| 2010/0236717 A1 | 9/2010 | Chung et al. | |
| 2013/0113169 A1 | 5/2013 | Sugi | |
| 2013/0321973 A1 | 12/2013 | Wiltsche et al. | |
| 2014/0071581 A1 | 3/2014 | Haas et al. | |
| 2014/0131198 A1 | 5/2014 | Teng et al. | |

OTHER PUBLICATIONS

International Search Report and Written Opinion of the International Searching Authority; PCT/US2016/019086; dated Apr. 18, 2016; 13 Pages; European Patent Office.

Niklaus et al; "Adhesive Wafer Bonding"; Journal of Applied Physics; 99, 2006; pp. 031101-1-031101-28.

Watanabe et al; "Electrostatic Force and Absorption Current of Alumina Electrostatic Chuck"; Jpn. J. Appl. Phys., 31, 1992, pp. 2145-2150.

* cited by examiner

APPARATUS AND METHOD TO ELECTROSTATICALLY CHUCK SUBSTRATES TO A MOVING CARRIER

CROSS-REFERENCE TO RELATED APPLICATIONS

This application claims the benefit of priority under 35 U.S.C. § 371 of International Patent Application Serial No. PCT/US16/19086, filed on Feb 23. 2016, which in turn claims the benefit of priority of U.S. Provisional Application Ser. No. 62/120477 filed on Feb. 25, 2015, the contents of each of which are relied upon and incorporated herein by reference in its entirety.

FIELD

This disclosure relates generally to a method of applying coatings to substrates and more particularly to a method of chucking substrates to a moving carrier.

BACKGROUND

Coatings are often applied to surfaces of glass or ceramic substrates to make the surfaces scratch-resistant or for other reasons. Examples of methods used to apply such coatings are physical vapor deposition and chemical vapor deposition. In one example coating setup, substrates are mounted on an exterior surface of a rotating drum, which is arranged vertically inside a vacuum chamber. Sputtering sources are arranged around the rotating drum. During the coating process, the drum is rotated about a vertical axis. The sputtering sources deposit atoms of coating material on the substrates as the drum rotates. One of the important considerations in this setup is how to mount the substrates on the rotating drum and keep the substrates secured on the rotating drum during the film deposition.

A simple method of mounting substrates on a rotating drum may be to tape or bond the substrates to the drum. With taping, the substrates will be slightly raised off the mounting surface of the drum by an amount equal to the thickness of the tape, making it possible for particles to accumulate at the backside of the substrates where the tapes are applied, which may result in undesired or non-uniform coating at the backside. In the case of bonding, there will be extra process steps needed to release the substrates from the drum as well as remove any adhesive residues from the substrates, all without damaging the substrates. If it is desired to coat both sides of the substrates, all these extra process steps would need to be carried in between coating both sides.

Another method that may be used to mount substrates on a rotating drum involves use of clamps that grip the edges of the substrates. In this case, the areas of the substrates gripped by the clamps will not receive the coating material, leading to non-uniform coating of the substrates. Also, the clamps can shield areas of the substrates from the coating atoms as the drum rotates, leading to further non-uniform coating of the substrates.

Another method commonly used to hold substrates is vacuum chucking. In vacuum chucking, small holes in the chuck behind the substrate provide a means to apply vacuum between the substrate and chuck, and atmospheric pressure exerted on the substrate provides the holding force. However, thin film deposition processes are often carried out in high vacuum (~$10^{-5}$ Torr) to prevent unwanted molecular species or particles from being trapped under the coating. Vacuum chucking is not effective in high vacuum plasma because the pressure differential exerted downward on the substrate is non-existent.

In the semiconductor fabrication industry, electrostatic chucking is commonly used to hold wafers during lithography processes. An electrostatic chuck typically includes an electrode encapsulated in an alumina ceramic disk. When a substrate, semiconductor or dielectric, is brought into contact with the alumina, the charge on the encapsulated electrode induces a charge polarization in the substrate, which then is electrostatically attracted to the electrode and held firmly in place by that charge. De-chucking is accomplished by turning off power to the electrode, which removes the induced polarization. To prevent permanent polarization in the substrate, polarity on the electrodes is frequently switched and power to the electrodes is pulsed.

Electrostatic chucking does not suffer from the challenges discussed earlier for the other chucking methods. However, electrostatic chucking faces a different kind of challenge for the rotating-drum-type coating process, i.e., how to maintain chucking and electrical interconnect to the chucking electrodes as the drum rotates rapidly. Similarly challenges may be faced in horizontal and vertical inline coating systems where the substrates have to be mounted on a carrier that is moving horizontally or vertically.

SUMMARY

A method and an apparatus for chucking a dielectric substrate to a moving carrier by electrostatic force are disclosed. In one embodiment, one or more electrostatic chucks are mounted to a movable member, which may be a rotatable drum member or a traveling carriage, and the electrostatic chucks are connected to a power supply using a dynamic electrical coupler, which may be a rotary electrical coupler or a sliding electrical coupler. In one embodiment, the electrical coupler uses moving and stationary insulated electrodes and a slip ring contact for transmission of electrical energy between the insulated electrodes. The dynamic electrical coupler maintains high voltage to the electrostatic chuck even while the electrostatic chuck is moving rapidly.

BRIEF DESCRIPTION OF THE DRAWINGS

The following is a description of the figures in the accompanying drawings. The figures are not necessarily to scale, and certain features and certain views of the figures may be shown exaggerated in scale or in schematic in the interest of clarity and conciseness.

DETAILED DESCRIPTION

Figure 1:
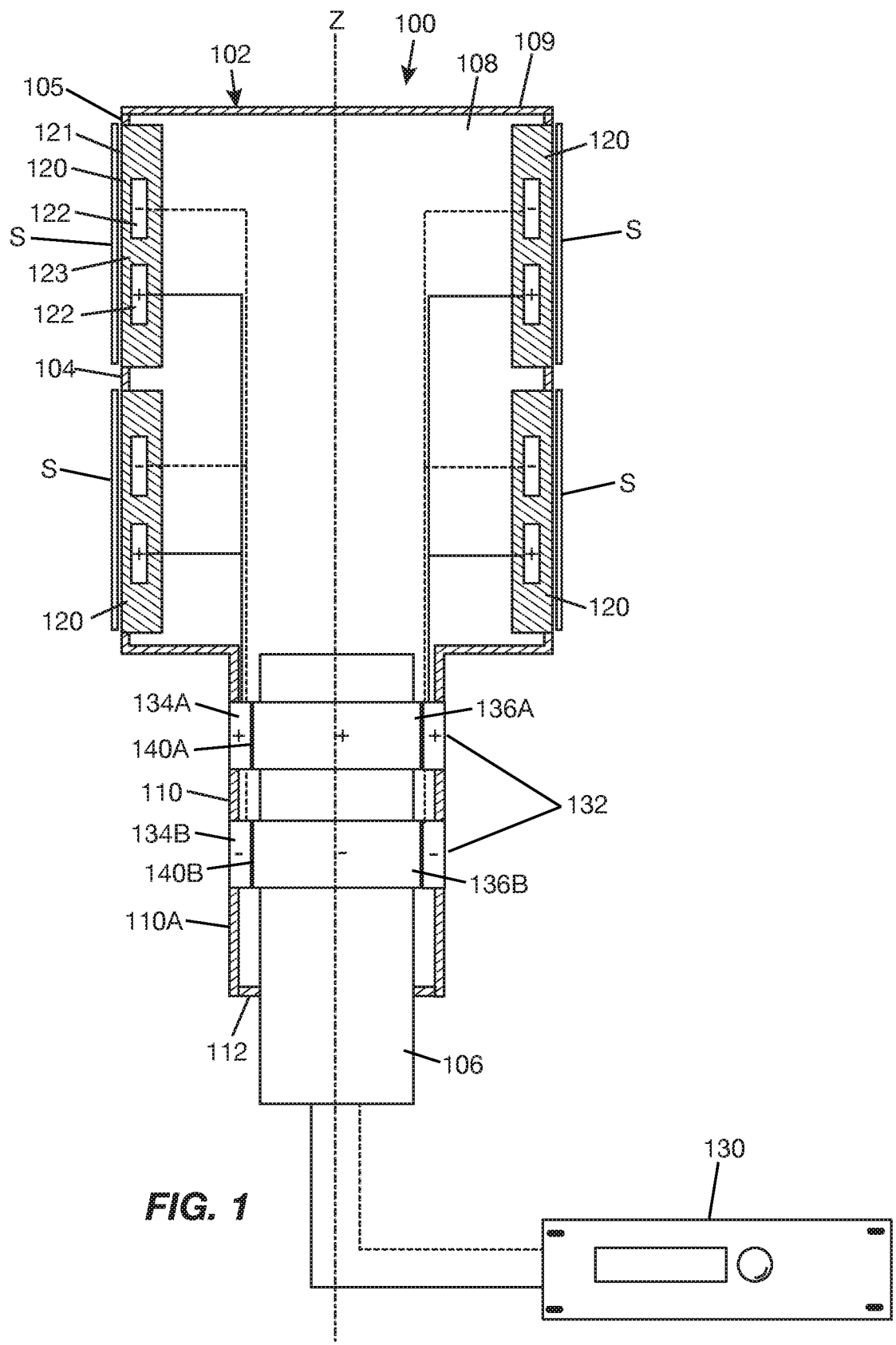
FIG. 1 shows an electrostatic chucking apparatus according to one embodiment.

FIG. 1 shows a electrostatic chucking apparatus 100 according to one embodiment. The apparatus 100 includes a drum 102 having a rotatable drum member 104 and a stationary drum member 106. The rotatable drum member 104 rotates about an axial axis Z. In one embodiment, the axial axis Z is aligned with the vertical, as shown in FIG. 1. In other embodiments, the rotational axial Z may be aligned with the horizontal or may be at an angle to the horizontal or vertical. The rotatable drum member 104 may be generally cylindrical in shape and has a cavity 108. A cover 109 may be provided to seal the top end of the cavity 108 from the environment. The stationary drum member 106 may be generally cylindrical in shape and is received at least partially in the cavity 108 such that a base portion 110 of the rotatable drum member 104 circumscribes the stationary drum member 106. A rotary seal 112 may be arranged in between the stationary drum member 106 and the base portion 110 to seal the bottom end of the cavity 108 from the environment.

In one embodiment, one or more electrostatic chucks 120 are mounted inside the cavity 108 of the rotatable drum member 104. In one embodiment, the mounting is such that a chucking face 121 of the electrostatic chuck 120 is located proximate an outer surface 105 of the rotatable drum member 104. The chucking face 121 may or may not be flush with the outer surface 105. The chucking face 121 may have a 2D shape or 3D shape, depending on the shape profile of the substrate S to be clamped to the chucking face 121. Each electrostatic chuck 120 includes one or two electrodes 122 encapsulated in a dielectric material 123, typically a high dielectric such as alumina. The electrostatic chucks 120 may be Coulomb style chucks or Johnsen-Rahbeck (J-R) style chucks, examples of which are illustrated in FIGS. 2A-2D.

Figure 2A:
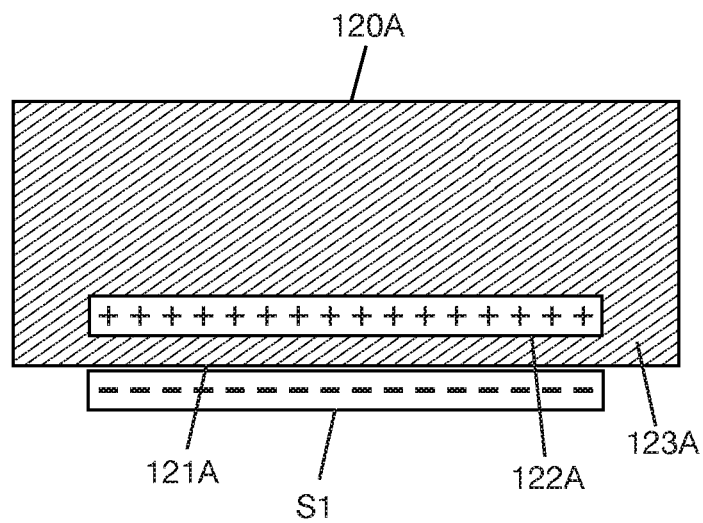
FIG. 2A shows a monopolar Coulomb chucking.

In the monopolar Coulomb chuck 120A shown in FIG. 2A, a single electrode 122A is encapsulated in a dielectric material 123A, such as alumina. The electrode 122A has one polarity, which induces the opposite polarization in the substrate S1, resulting in electrostatic attraction of the substrate S1 to the chucking face 121A.

Figure 2B:
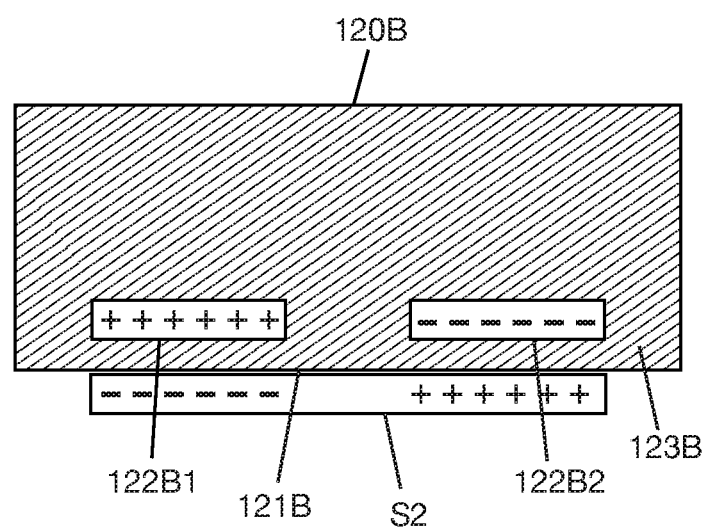
FIG. 2B shows a bipolar Coulomb chucking.

In the bipolar Coulomb chuck 120B shown in FIG. 2B, two electrodes 122B1, 122B2 are encapsulated in a dielectric material 123B. The electrodes 122B1, 122B2 have opposite polarities and induce corresponding opposite polarizations in opposite sections of the substrate S2, which would result in electrostatic attraction of the substrate S to the chucking face 121B.

Figure 2C:
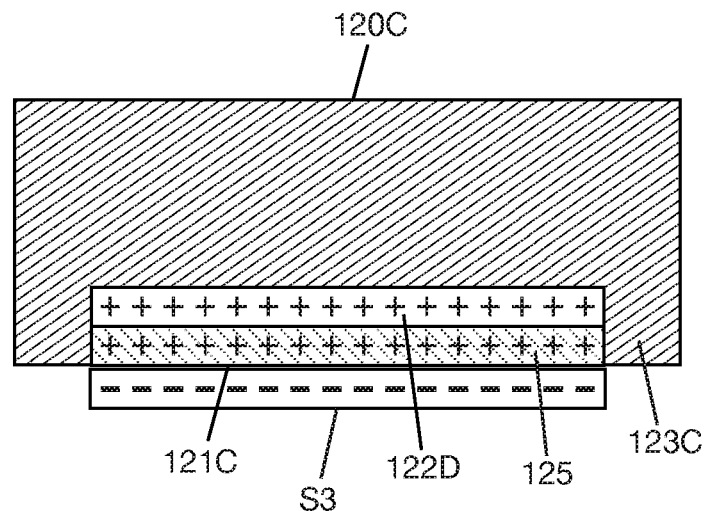
FIG. 2C shows a monopolar Johnsen-Rahbeck chucking.

In the monopolar J-R chuck 120C shown in FIG. 2C, a single electrode 122D is encapsulated in a dielectric material 123C, such as alumina. A conductive layer 125 is formed in the dielectric material 123C, between the electrode 122D and the chucking face 121C. The conductive layer 125 provides conductive pathways for charges to migrate from the electrode 122D to the chucking face 121C, resulting in a very short distance between the charges and the substrate S3 with a high attractive force. The conductive layer 125 may be alumina doped with titania, for example.

Figure 2D:
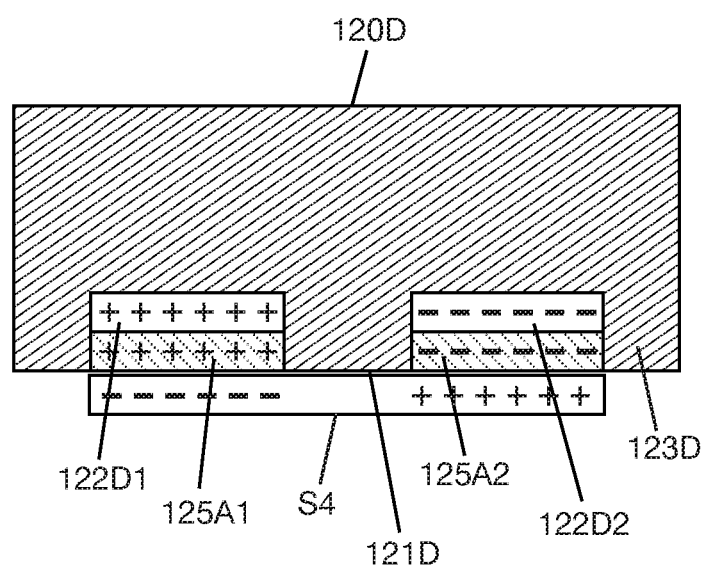
FIG. 2D shows a bipolar Johnsen-Rahbeck chucking.

In the bipolar J-R chuck 120D shown in FIG. 2D, two electrodes 122D1, 122D2 are encapsulated in a dielectric material 123D, with corresponding conductive layers 125A1, 125A2 for migration of charges to the chucking face 121D. The electrodes 122D1, 122D2 will induce polarization in the substrate S4, resulting in attraction of the substrate S4 to the chucking face 121D.

Returning to FIG. 1, the electrodes 122 of the electrostatic chucks 120 are connected to a power supply 130 through a rotary electrical coupler 132. In one embodiment, the rotary electrical coupler 132 includes rotary insulated rings 134A, 134B mounted inside the base portion 110 of the rotatable drum member 104. The insulated rings 134A, 134B are called "rotary" because they are coupled to the rotatable drum member 104. An "insulated ring" may be regarded as an insulated electrode in the form of a ring. The insulated rings 134A, 134B may or may not be exposed at the outer circumference 110A of the drum base portion 110. Each insulated ring 134A, 134B generally includes an electrode encapsulated within a dielectric material. The rotary insulated rings 134A, 134B are connected to the electrodes 122 of the electrostatic chucks 120. The polarities shown on the rotary insulated rings 134A, 134B in FIG. 1 are for illustration purposes only. That is, it is possible to reverse these polarities. Also, the rotary electrical coupler 132 may include only one rotary insulated ring if the electrostatic chucks 120 are monopolar.

In one embodiment, the rotary electrical coupler 132 may further include stationary insulated rings 136A, 136B mounted on the stationary drum member 106. The insulated rings 136A, 136B are called "stationary" because they are coupled to the stationary drum member 106. Each insulated ring 136A, 136B generally includes an electrode encapsulated within a dielectric material. The stationary insulated rings 136A, 136B are mounted such that each stationary insulated ring 136A, 136B is at an axial position corresponding to one of the rotary insulated rings 134A, 134B. For example, the upper stationary insulated ring 136A is at an axial position corresponding to the upper rotary insulated ring 134A, and the lower stationary insulated ring 136B is at an axial position corresponding to the lower rotary insulated ring 134B. In addition, the stationary insulated rings 136A, 136B are located within (or radially inward of) the corresponding rotary insulated rings 134A, 134B. The polarities shown on the stationary insulated rings 136A, 136B in FIG. 1 are for illustration purposes only and could be reversed. Also, the rotary electrical coupler 132 may include only one stationary insulated ring if the electrostatic chucks 120 are monopolar.

The stationary insulated rings 136A, 136B are connected to the power supply 130. In one embodiment, to transmit power from the stationary insulated rings 136A, 136B to the rotary insulated rings 134A, 134B, slip ring contacts 140A, 140B are located between opposing surfaces of the corresponding rotary insulated rings 134A, 134B and the stationary insulated rings 136A, 136B. The term "slip ring contact" is used to refer to any structure that permits electrical energy to be transmitted between a stationary member and a moving member. Examples of rotary slip ring contacts are illustrated in FIGS. 3A-3C.

Figure 3A:
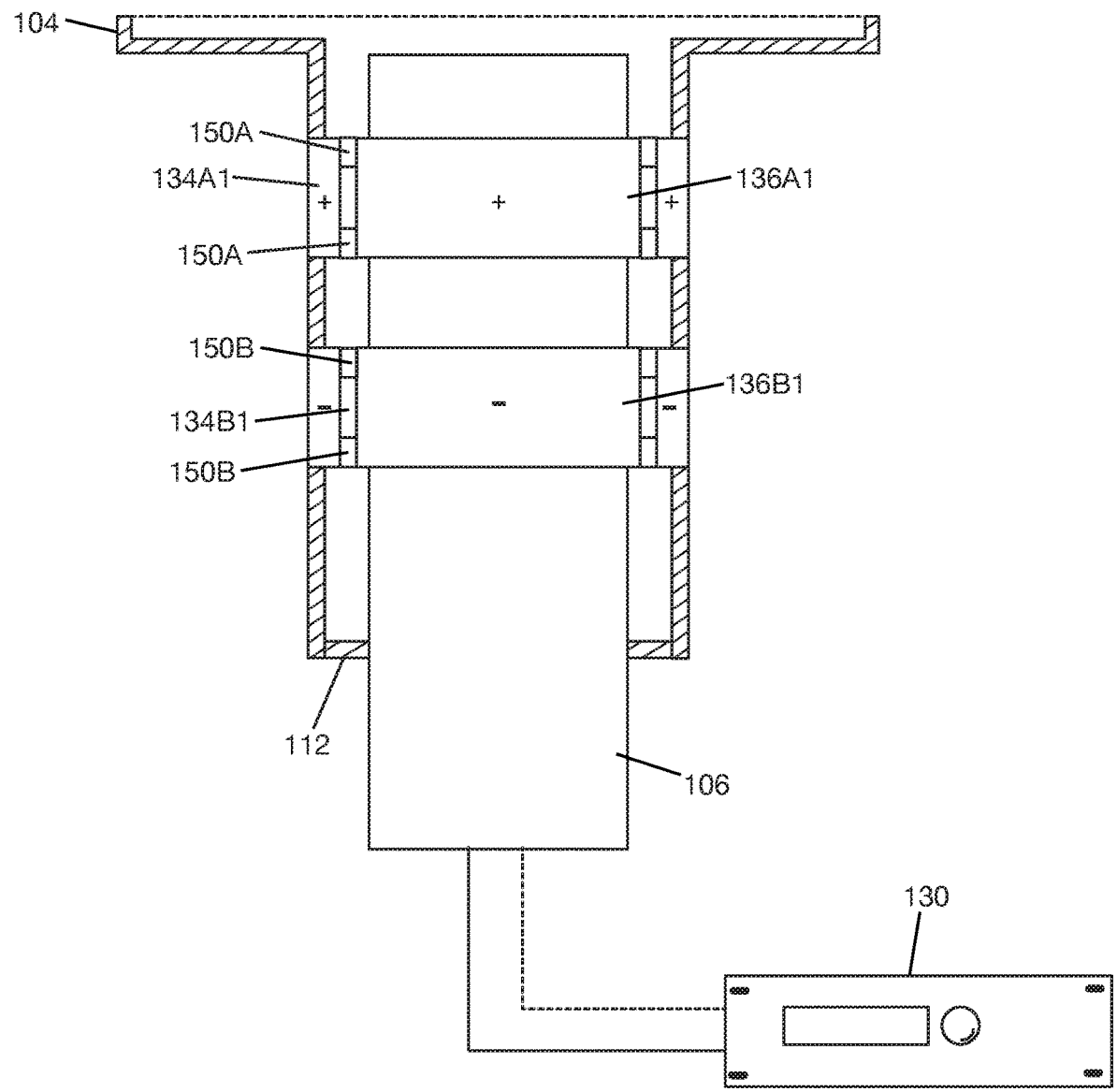
FIG. 3A shows use of roller bearings to couple electrical energy between rotary and stationary insulated rings according to one embodiment.
Figure 3B:
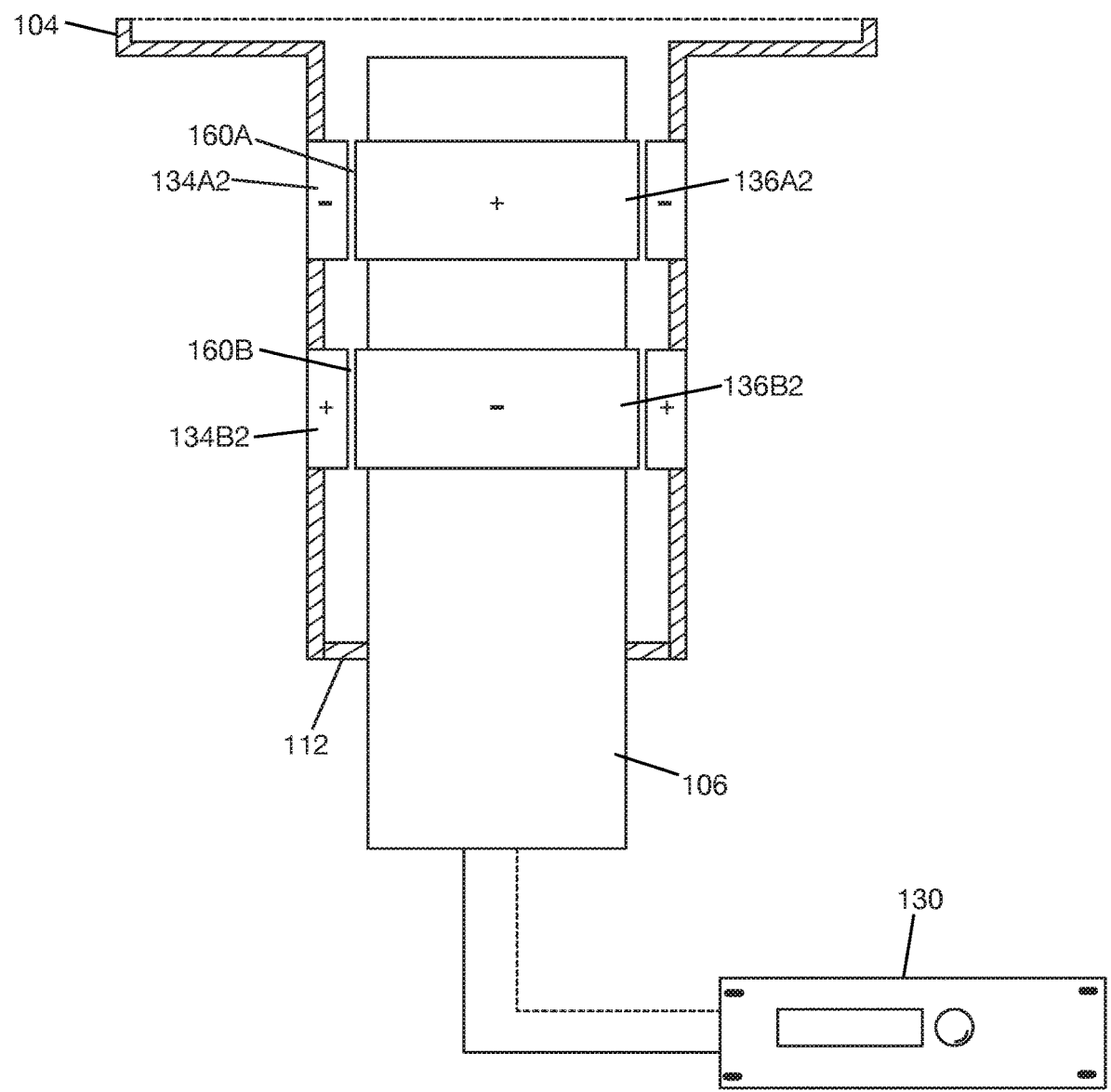
FIG. 3B shows use of an air gap to couple electrical energy between rotary and stationary insulated rings according to another embodiment.
Figure 3C:
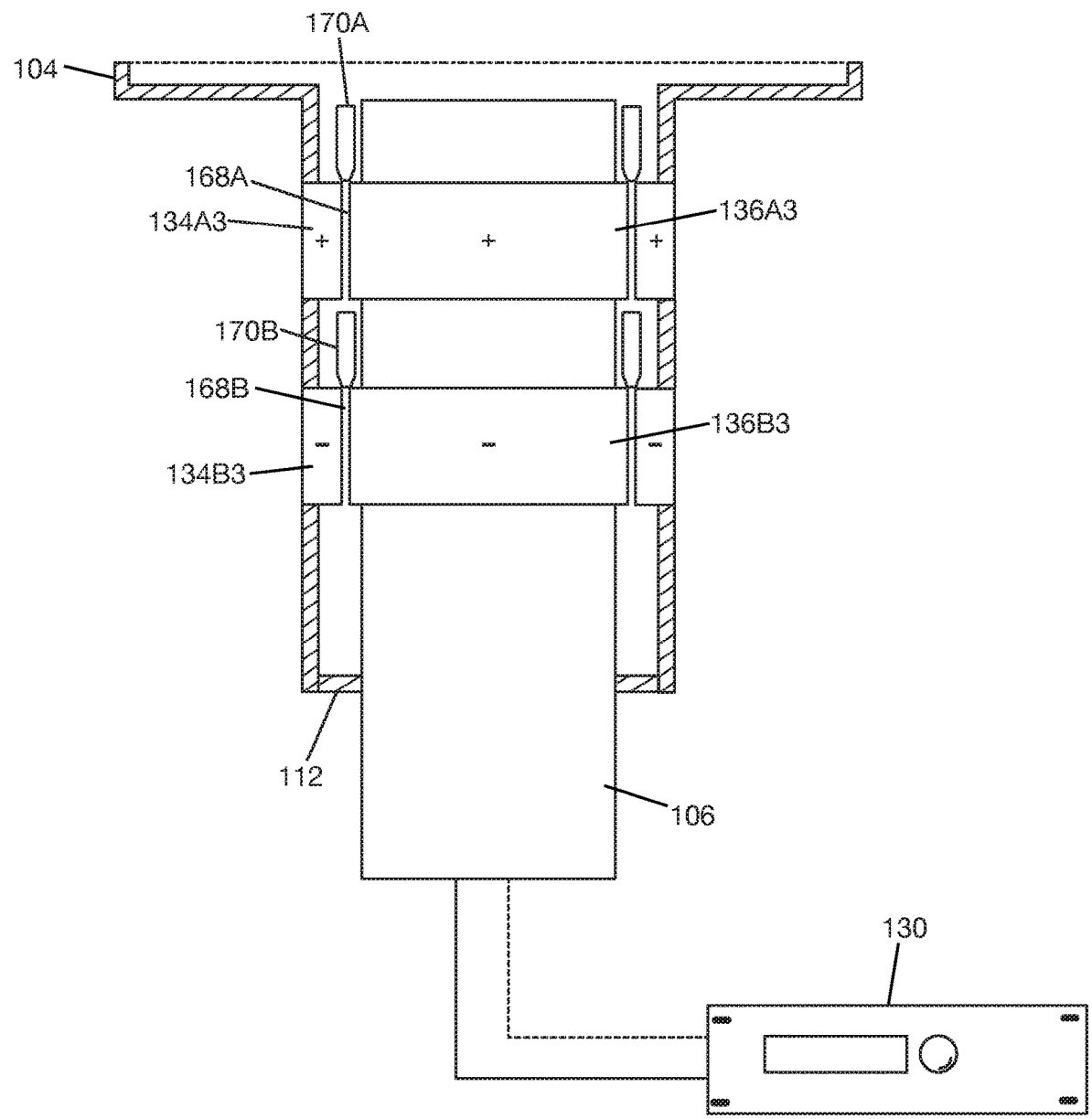
FIG. 3C shows use of ionized argon to couple electrical energy between rotary and stationary insulated rings according to another embodiment.

FIGS. 3A-3C use the numbering convention in FIG. 1 together with suffixes to facilitate mapping of the examples of FIGS. 3A-3C to the system of FIG. 1. For example, stationary insulated rings 136A1, 136A2, 136A3 in FIGS. 3A-3C will correspond to the stationary insulated ring 136 in FIG. 1, and rotary insulated rings 134A1, 134A2, 134A3 in FIGS. 3A-3C will correspond to the rotary insulated ring 134 in FIG. 1.

In FIG. 3A, roller bearings 150A are arranged between the opposing surfaces of the stationary insulated ring 136A1 and rotary insulated ring 134A1. Similarly, roller bearings 150B are arranged between the opposing surfaces of the stationary insulated ring 136B1 and rotary insulated ring 134B1. The roller bearings 150A, 150B correspond to the slip ring contacts 140A, 140B in FIG. 1. The roller bearings 150A, 150B will support rotation of the rotary insulated rings 134A1, 134B1 relative to the corresponding stationary insulated rings 136A1, 136B1. The roller bearings 150A, 150B will also provide conduction paths between the stationary insulated rings 136A1, 136B1 and the corresponding rotary insulated rings 134A1, 134B1.

In FIG. 3B, air gaps 160A, 160B are provided between the opposing surfaces of the stationary insulated rings 136A2, 136B2 and corresponding rotary insulated rings 134A2, 134B2. As mentioned earlier, the stationary insulated rings 136A2, 136B2 are electrodes encapsulated in a high dielectric, such as alumina. For this embodiment, the encapsulation wall is preferably thin so that charges may be formed on the rotary insulated rings 134A2, 134B2 by induction. By induction, a high charge on the stationary insulated rings 136A2, 136B2 attracts the opposite charge on corresponding rotary insulated rings 134A2, 134B2. This produces an opposite charge on the electrostatic chuck electrodes (not shown in FIG. 3B; see 122 in FIG. 1) coupled to the rotary insulated rings 134A2, 134B2, causing the electrodes to function as if they were physically connected by conductors to the power supply. One possible advantage of this embodiment is that there are no physical contacts subject to wear over time.

In FIG. 3C, air gaps 168A, 168B are provided between the opposing surfaces of the stationary insulated rings 136A3, 136B3 and corresponding rotary insulated rings 134A3, 134B3. Ionized gas in the air gaps 168A, 168B will provide a conductive path between the stationary insulated rings 136A3, 136B3 and corresponding rotary insulated rings 134A3, 134B3. The ionized gas may be ionized argon, for example. Corona ionizing jets 170A, 170B may be arranged to spray the ionized gas, e.g., ionized argon, into the air gaps 168A, 168B.

Returning to FIG. 1, each electrostatic chuck 120 can be operated to clamp one or more substrates S to the outside surface of the rotatable drum member 104 by electrostatic force. For electrostatic chucking to work, the substrate S will need to be made of a material that can be clamped by electrostatic attraction. These materials are typically semiconductors or dielectrics. In one embodiment, the substrates S to be clamped onto the rotatable drum member 104 are made of glass, ceramic, or glass-ceramic material. Power supply to the electrodes 122 of the electrostatic chucks 120 through the rotary electrical coupler 132 will create charges in the electrostatic chucks. The presence of charges in each electrostatic chuck 120 will induce polarization in the substrate S adjacent to the chuck face 121, thereby causing an attractive force between the substrate S and the chuck 120. (For a Coulomb style chuck, the charges in the chuck are created instantaneously. For a J-R style chuck, it will take several minutes for the charges to migrate through the doped chuck dielectric and provide sufficient clamping force.) The attractive force between the substrate and the corresponding electrostatic chuck 120 will remain as long as the charge is applied to the electrostatic chuck 120. To unclamp the substrate S from the chuck 120, the charge on the chuck is removed, for example, by turning off the power supply 130. In the case of a Coulomb style chuck, removal of the charge from the chuck will occur almost immediately after turning off the power supply. For a J-R style chuck, it will take several minutes after turning off the power supply for the charge to dissipate from the chuck.

The power supply 130 used to operate the electrostatic chucks 120 may be a standard high voltage low current DC power supply in the 1 to 50 kV range, with enough charge production capability to compensate for the amount of charge needed to electrostatically attract the desired quantity of substrates S. In addition, to prevent permanent polarization of the substrates S, the polarity of the electrodes 122 of the electrostatic chucks 120 needs to be reversed periodically, and this can be done programmatically at the power supply level.

The rotary electrostatic chucking apparatus 100 may be used in any application where clamping of substrates to a rotating member is desired. These applications may include, for example, coating and etching applications.

Figure 4:
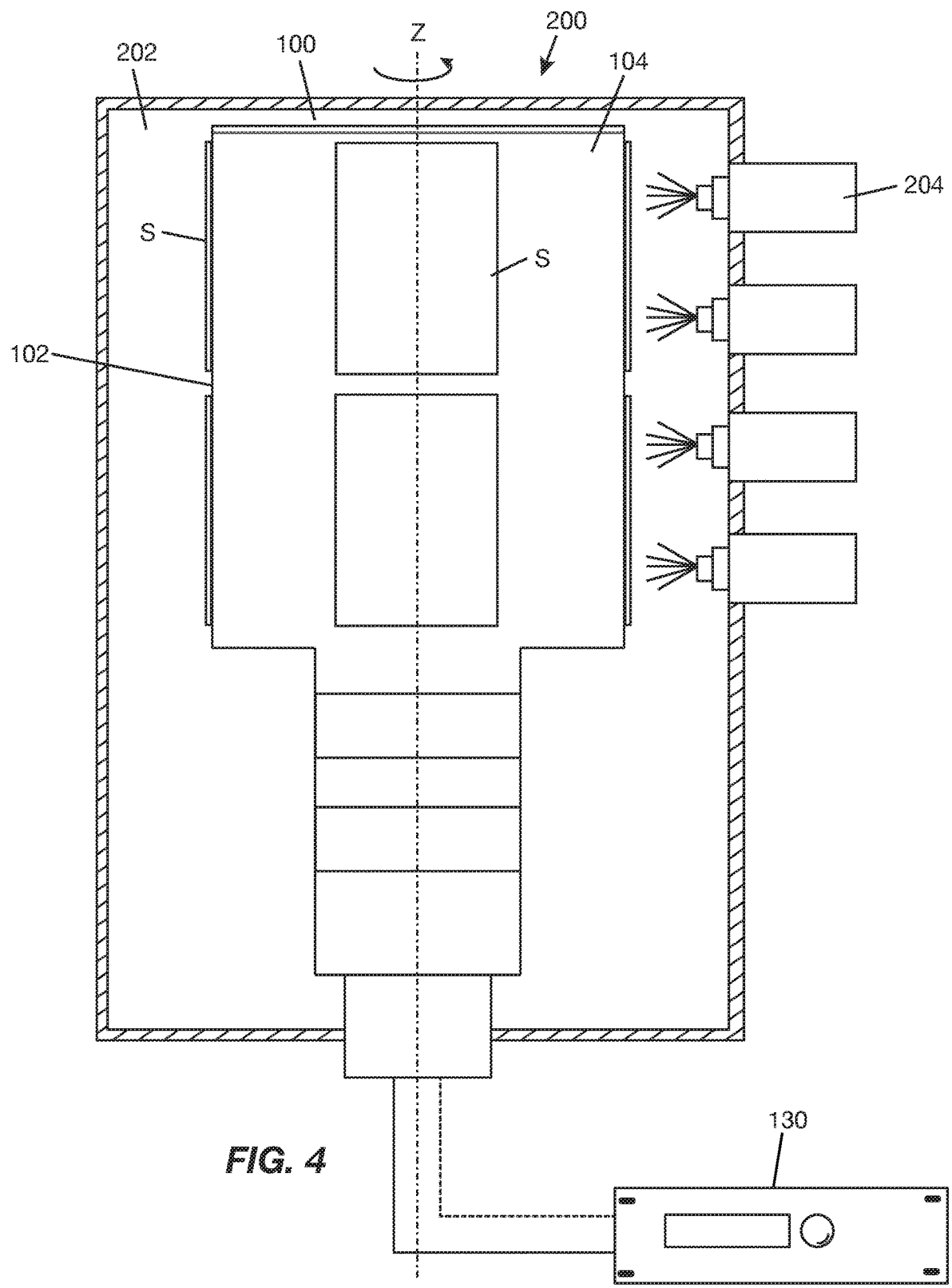
FIG. 4 shows a system for coating substrates.

For illustration purposes, FIG. 4 shows a system 200 for coating substrates. The system 200 includes the rotary electrostatic chucking apparatus 100 disposed within a processing chamber 202. The substrates S to be coated, which may be glass, ceramic, or glass-ceramic substrates, have been clamped to the outside surface of the rotatable drum member 104 by the electrostatic chucks (120 in FIG. 1). For the coating process, atmospheric pressure may be maintained inside the drum cavity (108 in FIG. 1). Also, the drum cavity may be pressurized with an inert gas such as nitrogen or dried purified air to provide a high resistance to any electric potential among the electrostatic chucks. Within the processing chamber 202, the outside surface of the drum 102, and the substrates S clamped thereon, may be exposed to high vacuum plasma for thin film deposition or other coating process. In one example, sputtering sources 204 may be arranged to deposit coating atoms on the substrates S while the rotatable drum member 104 is rotating with the electrostatically clamped substrates S. It should be noted, however, that use of the rotary electrostatic chucking apparatus 100 is not limited to coating by sputtering.

While the rotatable drum member 104 is spinning rapidly, the rotary electrical coupler (132 in FIG. 1) maintains high voltage to the electrodes (122 in FIG. 1) of the electrostatic chucks (120 in FIG. 1) so that the electrostatic force holding the substrates S to the rotatable drum member 104 overcomes the centrifugal force on the substrates S. The electrostatic chucks (120 in FIG. 1) hold the substrates S without engaging the edges of the substrates S, allowing uniform coating of the front sides and edges of the substrates. The electrostatic chucking is also achieved without use of adhesives on the backside of the substrates S.

For uniform coating of the substrates, the flatness of the substrate S will be maintained by the flatness of the chucking face (121 in FIG. 1), which means that the shape profile of the chucking face should be selected based on the shape profile of the backside of the substrate, where the backside is considered to be the side of the substrate that will contact the chucking face. The parallelism of the electrostatic chuck electrodes (122 in FIG. 1) to the substrates is also important to achieving uniform coating. In addition, the electrostatic chucks may be water-cooled during operation. This may require a rotating valve to circulate the coolant to the chucks while the rotatable drum member 104 is spinning.

Figure 5A:
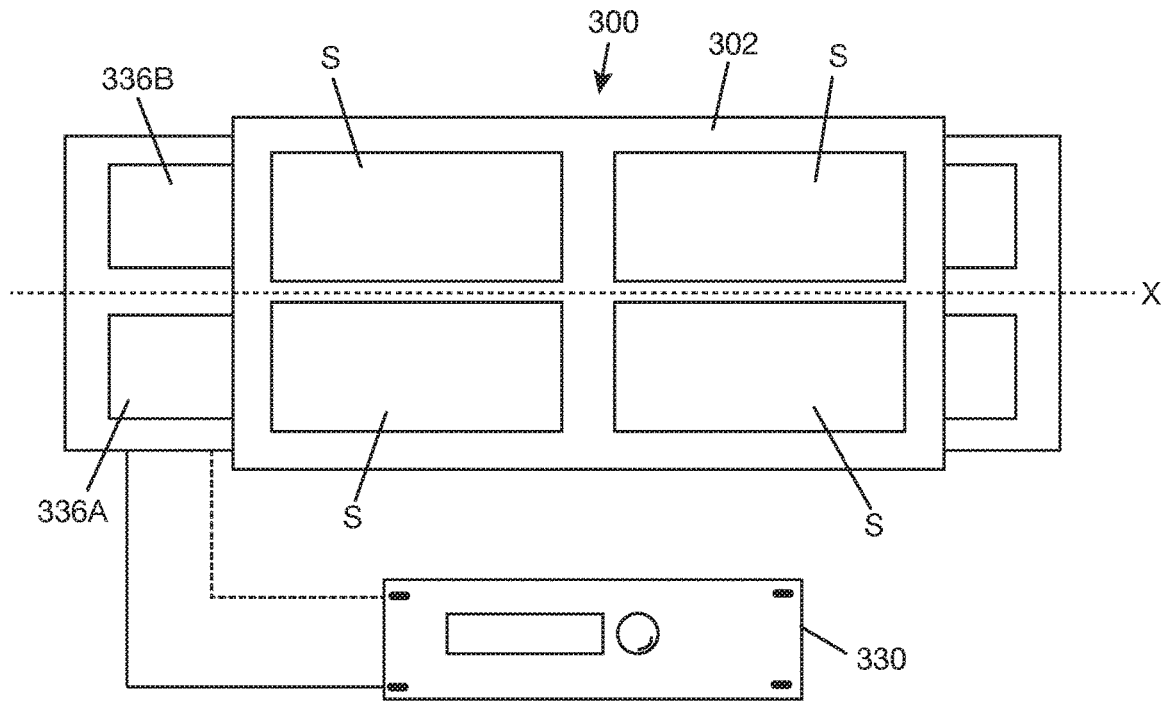
FIG. 5A shows an electrostatic chucking apparatus according to another embodiment.
Figure 5B:
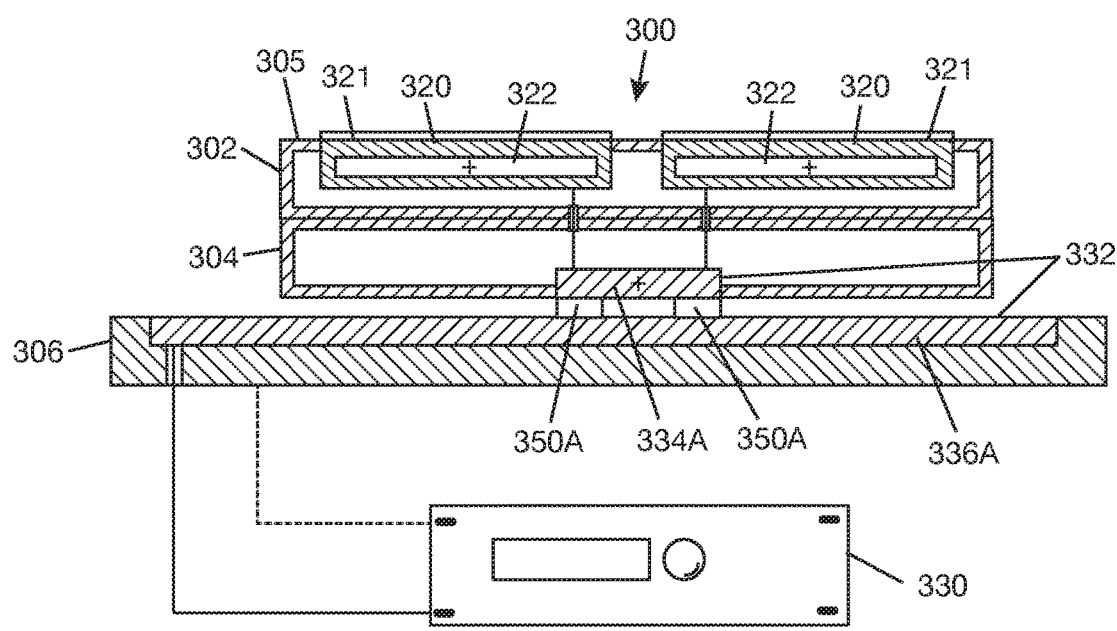
FIGS. 5B and 5C show vertical cross-sections of the electrostatic chucking apparatus of FIG. 5A.
Figure 5C:
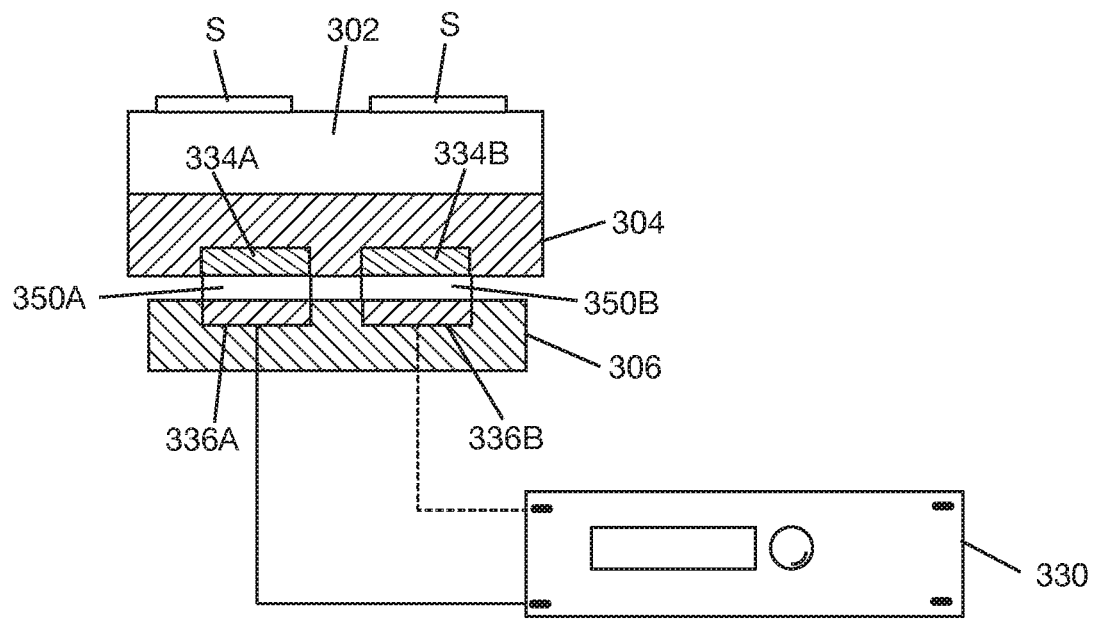

FIGS. 5A-5C show an electrostatic chucking apparatus 300 according to another embodiment. The apparatus 300 includes a carrier 302, a movable base 304, and a track 306.

The movable base 304 is attached to the carrier 302. The movable base 304 may be formed separately or integrally with the carrier 302. The combination of the carrier 302 and movable base 304 may be regarded as a traveling carriage or a movable member of the apparatus, while the track 306 may be regarded as a stationary member of the apparatus. The movable base 304 is arranged to travel along an axial axis X of the track 306. The track 306 may be arranged horizontally, as in FIGS. 5A-5C, vertically, or at some other angle relative to the horizontal. One or more electrostatic chucks 320 are mounted to the carrier 302. The mounting may be such that the chucking faces 321 of the electrostatic chucks 320 are located proximate an outer surface 305 of the carrier 302, where substrates will be clamped. The chucking faces 321 may or may not be flush with the outer surface 305. Each chucking face 321 may have a 2D or 3D shape, depending on the shape profile of the substrate to be clamped to the chucking face 321. The electrostatic chucks 320 may have a structure similar to any of the previously described electrostatic chucks (120, 120A, 120B, 120C, 120D).

The electrodes 322 of the electrostatic chucks 320 are connected to a power supply 330 through a sliding electrical coupler 332. The power supply 330 may have similar characteristics to the previously described power supply (130). In one embodiment, the sliding electrical coupler 332 includes "moving" insulated electrodes 334A, 334B (FIG. 5C) mounted to the movable base 304. The insulated electrodes 334A, 334B are called moving because they are coupled to the movable base 304. The insulated electrodes 334A, 334B are electrically connected to the electrodes 322 of the electrostatic chucks 320. The sliding electrical coupler 332 further includes "stationary" insulated electrodes 336A, 336B mounted on the track 306, with the stationary insulated electrode 336A corresponding in position to the moving insulated electrode 334A and the stationary insulated electrode 336B corresponding in position to the moving insulated electrode 334B. The stationary insulated electrodes 336A, 336B are connected to the power supply 330. The stationary insulated electrode 336A may have one polarity while the stationary insulated electrode 336B has the reverse polarity. Each of the insulated electrodes 336A, 336B may be made of a single insulated electrode or a series of insulated electrodes arranged end-to-end. Sliding slip ring contacts are used to couple electrical energy between the stationary insulated electrodes 336A, 336B and the corresponding moving insulated electrodes 334A, 334B. Examples of sliding slip ring contacts are illustrated in FIGS. 5C-5E.

In FIG. 5C, sliding contacts 350A, 350B are arranged between opposing surfaces of the moving insulated electrodes 334A, 334B and the stationary insulated electrodes 336A, 336B. The sliding contacts 350A, 350B may be, for example, spring loaded brush contacts or other suitable sliding electrical contacts. The sliding contacts 350A, 350B may be attached to the moving insulated electrodes 334A, 334B or to the stationary insulated electrodes 336A, 336B. The sliding contacts 350A, 350B will provide conduction paths between the stationary insulated electrodes 336A, 336B and the corresponding moving insulated electrodes 334A, 334B as the movable base 304 travels along the track 306.

Figure 5D:
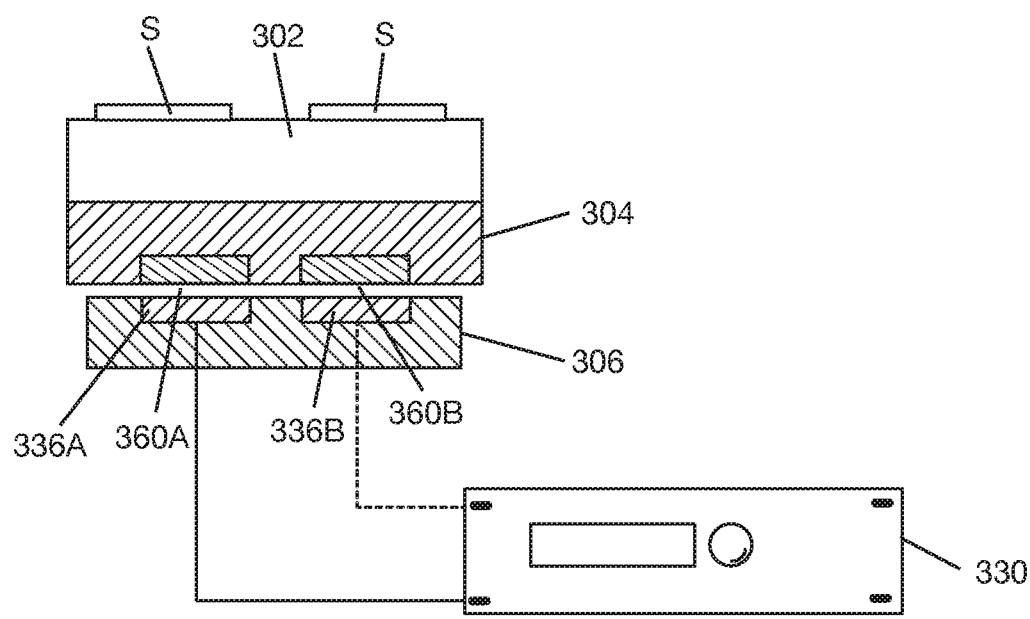
FIG. 5D shows use of an air gap to couple electrical energy between moving and stationary insulated electrodes according to one embodiment.

In FIG. 5D, air gaps 360A, 360B are provided between the opposing surfaces of the stationary insulated electrodes 336A, 336B and corresponding moving insulated electrodes 334A, 334B. In this embodiment, power will be transmitted from the stationary insulated electrodes 336A, 336B to the corresponding moving insulated electrodes 334A, 334B by induction, as previously explained above for the embodiment of FIG. 3B.

Figure 5E:
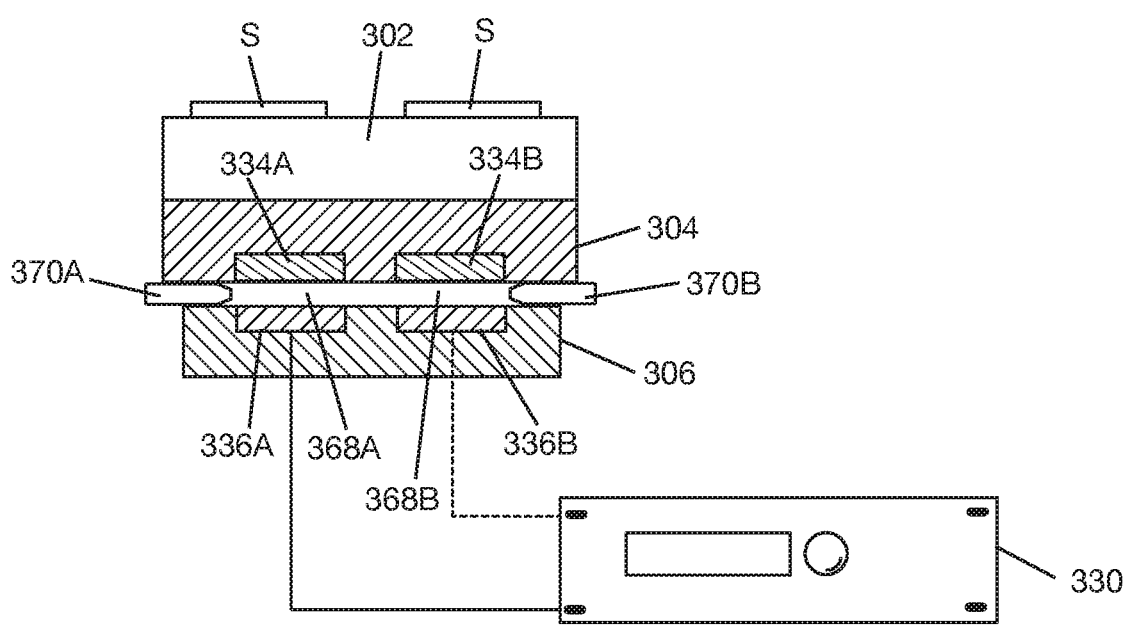
FIG. 5E shows use of ionized argon to couple electrical energy between moving and stationary insulated electrodes according to one embodiment.

In FIG. 5E, air gaps 168A, 168B are provided between the opposing surfaces of the stationary insulated electrodes 336A, 336B and the corresponding moving insulated electrodes 334A, 334B. Ionized gas in the air gaps 168A, 168B will provide a conductive path between the stationary insulated electrodes 336A, 336B and the corresponding moving insulated electrodes 334A, 334B. The ionized gas may be argon, for example. Corona ionizing jets, or other jetting apparatus, 370A, 370B may be arranged to spray the ionized gas, e.g., ionized argon, into the air gaps 368A, 368B.

In the coating example described above with reference to FIG. 4, the electrostatic chucking apparatus 300 illustrated in FIGS. 5A-5E may be used in place of the electrostatic chucking apparatus 100. In general, the electrostatic chucking apparatus 300 may be used in inline systems. Both of the electrostatic chucking apparatuses (100, 300) described above may be used in any coating system requiring clamping of substrates to a moving surface. Examples of coating systems are those based on physical vapor deposition, chemical vapor deposition, and plasma enhanced chemical vapor deposition.

The electrostatic chucking apparatuses (100, 300) described above may be used for chucking glass, glass-ceramics, and ceramics. Examples of materials that can be chucked include ion exchanged strengthened glass, high optical clarity glass, surface treated glass for antimicrobial and scratch resistant glasses, soda lime glass, borosilicate glass, high purity fused silica, quartz, polycrystalline glass-ceramic compositions such as Macor® machinable ceramic and Dicor® glass-ceramic.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

The invention claimed is:

1. An electrostatic chucking apparatus, comprising:
a movable member arranged for movement relative to an axial axis;
at least one electrostatic chuck comprising at least one electrode encapsulated in a dielectric material, the at least one electrostatic chuck being coupled to the movable member and having a face located proximate an outer surface of the movable member;
at least one first insulated electrode coupled to the movable member and the at least one electrostatic chuck;
a stationary member;
at least one second insulated electrode coupled to the stationary member in an axial position corresponding to the at least one first insulated electrode; and
a slip ring contact for coupling electrical energy from the at least one second insulated electrode to the at least one first insulated electrode.

2. The electrostatic chucking apparatus of claim 1, wherein the movable member is a rotatable drum member arranged for rotation about the axial axis, and wherein the at least one first insulated electrode and the at least one second insulated electrode are insulated rings.

3. The electrostatic chucking apparatus of claim 2, wherein the slip ring contact comprises at least one roller bearing between opposing surfaces of the at least one first insulated electrode and the at least one second insulated electrode.

4. The electrostatic chucking apparatus of claim 2, wherein the slip ring contact comprises an air gap.

5. The electrostatic chucking apparatus of claim 4, wherein the slip ring contact further comprises an ionized gas in the air gap.

6. The electrostatic chucking apparatus of claim 5, further comprising a jet device arranged to spray ionized gas into the air gap.

7. The electrostatic chucking apparatus of claim 2, wherein the stationary member is a stationary drum member aligned with the rotatable drum member along the axial axis and received at least partially in a cavity of the rotatable drum member, and wherein the stationary drum member and the rotatable drum member provide opposing surfaces between which the slip ring contact is located.

8. The electrostatic chucking apparatus of claim 1, wherein the slip ring contact comprises a sliding contact between the at least one second insulated electrode and the at least one first insulated electrode.

9. The electrostatic chucking apparatus of claim 1, wherein the slip ring contact comprises an air gap between opposing surfaces of the at least one second insulated electrode and the at least one first insulated electrode.

10. The electrostatic chucking apparatus of claim 9, wherein the slip ring contact further comprises an ionized gas in the air gap.

11. The electrostatic chucking apparatus of claim 10, further comprising a jet device arranged to spray ionized gas into the air gap.

12. The electrostatic chucking apparatus of claim 1, further comprising a power supply connected to the at least one stationary insulated electrode.

13. The electrostatic chucking apparatus of claim 1, wherein the stationary member is in the form of a track and the movable member is in the form of a traveling carriage arranged to travel along the track.

14. An electrostatic chucking method, comprising:
  mounting an electrostatic chuck to a movable member such that a face of the electrostatic chuck is located proximate an outer surface of the movable member;
  coupling at least one first insulated electrode to the movable member;
  coupling at least one second insulated electrode to a stationary member;
  arranging the stationary member relative to the movable member such that the at least one second insulated electrode is in opposing relation to the at least one first insulated electrode;
  forming a slip ring contact between the at least one first insulated electrode and the at least one second insulated electrode; and
  coupling the at least one second insulated electrode to a power supply.

15. The electrostatic chucking method of claim 14, wherein the stationary member is a stationary drum member and the movable member is a rotatable drum member, and wherein the arranging the stationary member relative to the movable member comprises arranging the rotatable drum member for rotation about an axial axis, aligning the stationary drum member with the rotatable drum member along the axial axis, and at least partially receiving the stationary drum member in a cavity of the rotatable drum member.

16. The method of claim 15, wherein the forming the slip ring contact comprises providing at least one roller bearing between opposing surfaces of the at least one first insulated electrode and the at least one second insulated electrode.

17. The method of claim 14, wherein the stationary member is in the form of a track and the movable member is in the form of a traveling carriage arranged to travel along the track.

18. The method of claim 17, wherein the forming the slip ring contact comprises providing at least one sliding contact between the at least one first insulated electrode and the at least one second insulated electrode.

19. The method of claim 14, wherein forming the slip ring contact comprises providing an air gap between opposing surfaces of the at least one first insulated electrode and the at least one second insulated electrode.

20. The method of claim 14, wherein forming the slip ring contact comprises spraying ionized gas into an air gap between opposing surfaces of the at least one first insulated electrode and the at least one second insulated electrode.

* * * * *